United States Patent
Rada et al.

(10) Patent No.: US 9,590,572 B2
(45) Date of Patent: *Mar. 7, 2017

(54) LOGARITHMIC DETECTOR AMPLIFIER SYSTEM FOR USE AS HIGH SENSITIVITY SELECTIVE RECEIVER WITHOUT FREQUENCY CONVERSION

(71) Applicant: DockOn AG, Zurich (CH)

(72) Inventors: Patrick Antoine Rada, San Jose, CA (US); Forrest James Brown, Carson City, NV (US); Alexandre Dupuy, San Diego, CA (US)

(73) Assignee: DOCKON AG, Zurich (CH)

(*) Notice: Subject to any disclaimer, the term of this patent is extended or adjusted under 35 U.S.C. 154(b) by 0 days.

This patent is subject to a terminal disclaimer.

(21) Appl. No.: 14/216,945

(22) Filed: Mar. 17, 2014

(65) Prior Publication Data

US 2015/0070058 A1 Mar. 12, 2015

Related U.S. Application Data

(63) Continuation of application No. 14/213,529, filed on Mar. 14, 2014.
(Continued)

(51) Int. Cl.
*H04B 1/16* (2006.01)
*H03F 3/193* (2006.01)
(Continued)

(52) U.S. Cl.
CPC .............. *H03F 3/193* (2013.01); *H03F 1/56* (2013.01); *H03F 3/195* (2013.01); *H03L 7/06* (2013.01);
(Continued)

(58) Field of Classification Search
USPC ................ 455/254, 215, 334–342
See application file for complete search history.

(56) References Cited

U.S. PATENT DOCUMENTS 2,363,651 A * 11/1944 Crosby .................. H03D 11/06
329/334
2,644,081 A * 6/1953 Richman ............... H03D 11/00
455/210
(Continued)

FOREIGN PATENT DOCUMENTS

EP 0283401 A2 9/1988
EP 1384281 A2 1/2004
(Continued)

OTHER PUBLICATIONS

U.S. Appl. No. 14/213,529, filed Mar. 14, 2014, Rada et al.
(Continued)

*Primary Examiner* — Edward Urban
*Assistant Examiner* — Rui Hu
(74) *Attorney, Agent, or Firm* — Baker & Hostetler LLP

(57) ABSTRACT

A logarithmic detector amplifying (LDA) system is provided for use as a high sensitivity receive booster or replacement for a low noise amplifier in a receive chain of a communication device. The LDA system includes an amplifying circuit configured to receive an input signal having a first frequency and generate an oscillation based on the input signal, a sampling circuit coupled to the amplifying circuit and configured to terminate the oscillation based on a predetermined threshold to periodically clamp and restart the oscillation to generate a series of pulses modulated by the oscillation and by the input signal, and one or more resonant circuits coupled with the amplifying circuit and configured to establish a frequency of operation and to generate an output signal having a second frequency, the
(Continued)

second frequency being substantially the same as the first frequency.

20 Claims, 11 Drawing Sheets

Related U.S. Application Data

(60) Provisional application No. 61/877,218, filed on Sep. 12, 2013.

(51) Int. Cl.
*H03F 1/56* (2006.01)
*H03F 3/195* (2006.01)
*H04B 1/22* (2006.01)
*H03L 7/06* (2006.01)

(52) U.S. Cl.
CPC ......... *H04B 1/22* (2013.01); *H03F 2200/222* (2013.01); *H03F 2200/261* (2013.01); *H03F 2200/294* (2013.01); *H03F 2200/438* (2013.01); *H03F 2200/451* (2013.01)

(56) References Cited

U.S. PATENT DOCUMENTS

| | | | |
|---|---|---|---|
| 3,092,779 A | 6/1963 | De Niet | |
| 3,199,031 A | 8/1965 | Harris et al. | |
| 3,320,530 A | 5/1967 | Pearman | |
| 3,337,807 A | 8/1967 | Brown | |
| 3,602,819 A | 8/1971 | Abbott et al. | |
| 3,668,535 A * | 6/1972 | Lansdowne | G06G 7/24 327/351 |
| 3,724,954 A | 4/1973 | Dreyfoos | |
| 3,791,272 A | 2/1974 | Nobusawa | |
| 3,965,426 A | 6/1976 | Ringland | |
| 4,034,298 A * | 7/1977 | McFadyen | H03J 7/04 331/8 |
| 4,042,883 A | 8/1977 | Rae | |
| 4,160,953 A | 7/1979 | Matsuura et al. | |
| 4,393,514 A * | 7/1983 | Minakuchi | H03D 11/00 455/215 |
| 4,510,624 A | 4/1985 | Thompson et al. | |
| 4,577,503 A | 3/1986 | Imaino et al. | |
| 4,579,005 A | 4/1986 | Brown | |
| 4,609,994 A | 9/1986 | Bassim et al. | |
| 4,660,192 A | 4/1987 | Pomatto | |
| 4,882,768 A * | 11/1989 | Obana | H04B 1/1027 455/207 |
| 4,972,512 A * | 11/1990 | Garskamp | G06G 7/24 327/350 |
| 4,979,186 A | 12/1990 | Fullerton | |
| 1,424,065 A | 7/1992 | Armstrong | |
| 5,479,442 A | 12/1995 | Yamamoto | |
| 5,621,756 A * | 4/1997 | Bush | H04W 52/028 375/219 |
| 5,771,026 A | 6/1998 | Stengel | |
| 5,789,996 A | 8/1998 | Borodulin | |
| 5,818,875 A | 10/1998 | Suzuki et al. | |
| 5,995,814 A | 11/1999 | Yeh | |
| 6,035,002 A * | 3/2000 | Schleifer | H03D 11/08 318/264 |
| 6,054,900 A | 4/2000 | Ishida et al. | |
| 6,389,275 B1 * | 5/2002 | Kawashima | H03D 11/04 455/215 |
| 6,420,937 B1 | 7/2002 | Akatsuka et al. | |
| 6,421,535 B1 * | 7/2002 | Dickerson | H03D 11/02 333/109 |
| 6,518,856 B1 | 2/2003 | Casale et al. | |
| 6,538,528 B2 | 3/2003 | Louzir et al. | |
| 6,574,287 B1 | 6/2003 | Swaminathan et al. | |
| 6,668,165 B1 | 12/2003 | Cloutier | |
| 6,668,619 B2 | 12/2003 | Yang et al. | |
| 6,670,849 B1 | 12/2003 | Damgaard et al. | |
| 6,671,331 B1 | 12/2003 | Sakuma | |
| 7,215,936 B2 * | 5/2007 | Sadowski | H03D 11/02 455/215 |
| 7,400,904 B2 | 7/2008 | Cornwall et al. | |
| 7,423,931 B2 | 9/2008 | Martin et al. | |
| 7,567,099 B2 | 7/2009 | Edwards et al. | |
| 7,612,616 B2 | 11/2009 | Deng | |
| 7,751,857 B2 | 7/2010 | Beumer et al. | |
| 7,751,996 B1 | 7/2010 | Ardizzone et al. | |
| 7,819,022 B2 | 10/2010 | Hope | |
| 7,848,384 B2 * | 12/2010 | Pelissier | G01S 7/292 375/130 |
| 7,911,235 B2 | 3/2011 | Brown | |
| 8,040,204 B2 | 10/2011 | Brown | |
| 8,064,864 B2 | 11/2011 | Rofougaran | |
| 8,144,065 B2 | 3/2012 | Brown | |
| 8,149,173 B2 | 4/2012 | Brown | |
| 8,164,532 B1 | 4/2012 | Brown | |
| 8,265,769 B2 | 9/2012 | Denison | |
| 8,326,340 B2 | 12/2012 | Nalbantis et al. | |
| 8,364,098 B2 | 1/2013 | Ridgers | |
| 8,368,485 B2 | 2/2013 | Brown | |
| 8,385,910 B2 | 2/2013 | Nazrul et al. | |
| 8,462,031 B2 * | 6/2013 | Belot | H03M 3/484 341/143 |
| 8,542,768 B2 | 9/2013 | Kim et al. | |
| 8,644,776 B1 | 2/2014 | Nobbe et al. | |
| 8,655,441 B2 | 2/2014 | Fletcher et al. | |
| 8,676,521 B2 | 3/2014 | Vennelakanti et al. | |
| 2001/0037676 A1 | 11/2001 | Chang | |
| 2002/0109607 A1 | 8/2002 | Cumeral et al. | |
| 2004/0036554 A1 | 2/2004 | Veyres et al. | |
| 2004/0229585 A1 * | 11/2004 | Lu | H04B 1/30 455/215 |
| 2004/0240588 A1 | 12/2004 | Miller | |
| 2005/0003785 A1 | 1/2005 | Jackson et al. | |
| 2005/0009480 A1 | 1/2005 | Vakilian et al. | |
| 2005/0069051 A1 * | 3/2005 | Lourens | H03D 11/02 375/316 |
| 2005/0270172 A1 | 12/2005 | Bailey et al. | |
| 2006/0028297 A1 | 2/2006 | Kang et al. | |
| 2006/0226897 A1 * | 10/2006 | De Ruijter | H03D 3/26 329/315 |
| 2007/0030099 A1 * | 2/2007 | Carpentier | H03H 9/6433 333/189 |
| 2007/0066265 A1 | 3/2007 | May | |
| 2007/0105521 A1 * | 5/2007 | Granata | H03H 7/12 455/296 |
| 2007/0139130 A1 * | 6/2007 | Kim | H03D 11/06 331/185 |
| 2007/0207749 A1 | 9/2007 | Rozenblit et al. | |
| 2008/0101185 A1 | 5/2008 | Rozenblit et al. | |
| 2008/0176529 A1 * | 7/2008 | Lau | H04B 1/24 455/336 |
| 2008/0269841 A1 | 10/2008 | Grevious et al. | |
| 2009/0079524 A1 | 3/2009 | Cyr et al. | |
| 2009/0079607 A1 | 3/2009 | Denison et al. | |
| 2009/0147837 A1 | 6/2009 | Lau | |
| 2009/0322544 A1 | 12/2009 | McDowell | |
| 2010/0080270 A1 | 4/2010 | Chen et al. | |
| 2010/0152644 A1 | 6/2010 | Pesach et al. | |
| 2010/0225417 A1 | 9/2010 | Mistretta et al. | |
| 2010/0237935 A1 * | 9/2010 | Brown | H03D 1/18 329/305 |
| 2010/0308999 A1 | 12/2010 | Chornenky | |
| 2010/0313958 A1 | 12/2010 | Patel et al. | |
| 2011/0007844 A1 | 1/2011 | Park et al. | |
| 2011/0018777 A1 | 1/2011 | Brown | |
| 2011/0037516 A1 | 2/2011 | Nejati et al. | |
| 2011/0093220 A1 | 4/2011 | Yang et al. | |
| 2011/0212692 A1 | 9/2011 | Hahn et al. | |
| 2011/0234316 A1 | 9/2011 | Kim et al. | |
| 2011/0301882 A1 | 12/2011 | Andersen | |
| 2012/0019336 A1 | 1/2012 | Khan et al. | |
| 2012/0106560 A1 | 5/2012 | Gumaste | |
| 2012/0112852 A1 | 5/2012 | Manssen et al. | |
| 2012/0121030 A1 | 5/2012 | Luo et al. | |

(56) References Cited

U.S. PATENT DOCUMENTS

| | | | |
|---|---|---|---|
| 2012/0164644 A1 | 6/2012 | Neely et al. | |
| 2012/0190317 A1 | 7/2012 | Martineau et al. | |
| 2012/0280754 A1* | 11/2012 | Gorbachov | H03F 1/565 330/302 |
| 2013/0029350 A1 | 1/2013 | Cooper et al. | |
| 2013/0059548 A1* | 3/2013 | Umeda | H03B 5/1228 455/73 |
| 2013/0113666 A1 | 5/2013 | Orsi et al. | |
| 2013/0128934 A1* | 5/2013 | Kang | H04B 1/1027 375/219 |
| 2013/0222058 A1 | 8/2013 | Maniwa et al. | |
| 2014/0150554 A1 | 6/2014 | Rada et al. | |
| 2014/0154991 A1 | 6/2014 | Brown et al. | |
| 2014/0171002 A1* | 6/2014 | Park | H04L 25/063 455/226.1 |
| 2014/0266420 A1 | 9/2014 | Brown et al. | |
| 2014/0266962 A1 | 9/2014 | Dupuy et al. | |
| 2014/0269972 A1 | 9/2014 | Rada et al. | |
| 2014/0273898 A1 | 9/2014 | Brown et al. | |
| 2014/0287704 A1 | 9/2014 | Dupuy et al. | |

FOREIGN PATENT DOCUMENTS

| | | |
|---|---|---|
| GB | 2354329 A | 3/2001 |
| JP | 56-138340 A | 10/1981 |
| JP | 56-138342 A | 10/1981 |
| JP | S 60-249436 A | 12/1985 |
| JP | 10-075273 A | 3/1998 |
| WO | WO 00/35124 A2 | 6/2000 |
| WO | WO 02/084782 A2 | 10/2002 |
| WO | WO 2008/018836 A1 | 2/2008 |
| WO | WO 2008/075066 A2 | 6/2008 |
| WO | WO 2012/153147 A1 | 11/2012 |

OTHER PUBLICATIONS

Sanders B.J.; "Radical Combiner Runs Circles Around Hybrids," MicroWaves; Nov. 1980; vol. 19, No. 12; p. 55-58.

Caloz et al.;"Metamaterials for High-Frequency Electronics"; Proceedings of the IEEE; vol. 93; No. 10; Oct. 2005; p. 1744-1752.

Insam; "Designing Super-Regenerative Receivers"; Electronic World; Apr. 2002; 19 pages.

International Patent Application No. PCT/US2014/029832; Int'l Preliminary Report on Patentability; dated Mar. 11, 2015; 7 pages.

International Patent Application No. PCT/US2014/029577; Int'l Preliminary Report on Patentability; dated Jun. 19, 2015; 17 pages.

European Patent Application No. 13860466.5; Extended Search Report; dated Jul. 27, 2016; 7 pages.

European Patent Application No. 13859934.5; Extended Search Report; dated Jul. 27, 2016; 9 pages.

* cited by examiner

LOGARITHMIC DETECTOR AMPLIFIER SYSTEM FOR USE AS HIGH SENSITIVITY SELECTIVE RECEIVER WITHOUT FREQUENCY CONVERSION

CROSS REFERENCE TO RELATED APPLICATIONS

This application is a continuation of U.S. patent application Ser. No. 14/213,529, filed Mar. 14, 2014; which claims benefit under 35 U.S.C. §119(e) of Provisional U.S. Patent Application No. 61/877,218, filed Sep. 12, 2013, the contents of which is incorporated herein by reference in its entirety.

TECHNICAL FIELD

The present disclosure is related to the field of logarithmic amplifiers.

BACKGROUND

In many electronics applications, such as medical imaging, cellular communication, etc., it is desirable to be able to detect certain signals at low power levels among noise or other unwanted signals. Conventional solutions include logarithmic amplifiers ("log amps"). One characteristic of a log amp is that the output signal is a voltage proportional to the logarithm of the input signal, thereby making the log amp capable of receiving low level input signals and logarithmically amplifying them for output without amplifying the noise or other unwanted signals.

One class of log amps has multiple gain blocks, i.e., amplifiers, cascaded in series to achieve the logarithmic relationship. Due to the serial structure, differences in the performance of individual components tend to have an effect on the overall performance of the log amp. For example, the dynamic range may be limited; that is, the voltage output for very high or very low input signals does not conform to the logarithmic relationship. This can result in erroneous outputs for these extreme input values.

SUMMARY

A logarithmic detector amplifying (LDA) system is described for use as a high sensitivity receive booster or replacement for a low noise amplifier in a receive chain of a communication device. The LDA system includes an amplifying circuit configured to receive an input signal and generate an oscillation based on the input signal, a sampling circuit coupled to the amplifying circuit and configured to terminate the oscillation based on a predetermined threshold to periodically clamp and restart the oscillation to generate a series of pulses modulated by the oscillation and by the input signal, and one or more resonant circuits coupled with the amplifying circuit and configured to establish a frequency of operation and output a signal having RF frequencies.

DETAILED DESCRIPTION OF ILLUSTRATIVE EMBODIMENTS

A new type of logarithmic detector is described herein. Examples of structures and implementations of existing logarithmic detectors are described in U.S. Pat. No. 7,911,235, issued on Mar. 22, 2011, which is incorporated herein by reference. The logarithmic detector disclosed herein is further explained below with reference to the embodiment illustrated in FIG. 1.

Figure 1:
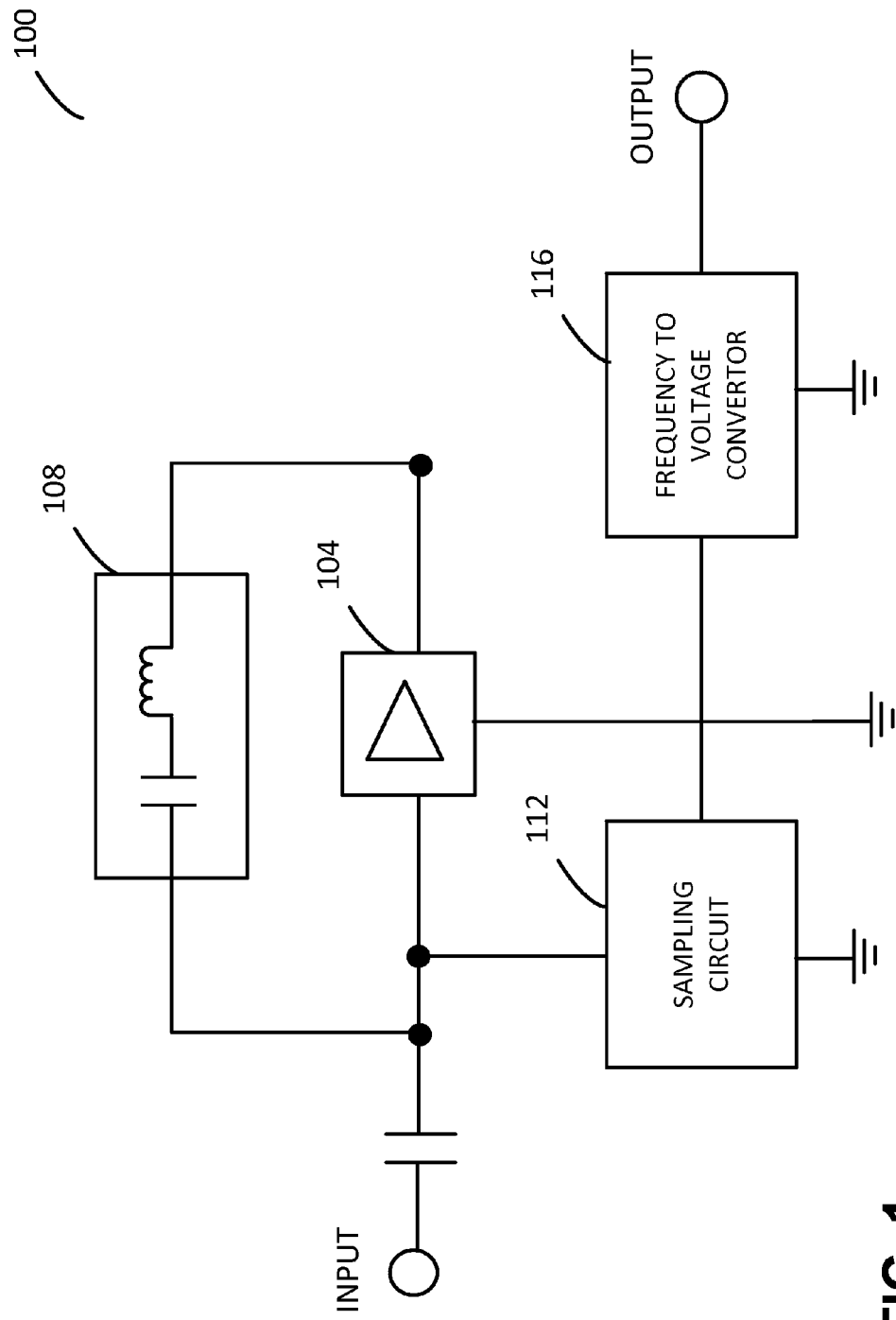
FIG. 1 is a block diagram illustrating an embodiment of a logarithmic detector.

FIG. 1 is a block diagram illustrating an embodiment of the logarithmic detector 100. In this embodiment, the input signal from the input terminal, labeled INPUT, may be received by an amplifying circuit 104. The amplifying circuit 104 may be configured to amplify the input signal and may include any suitable amplifying element, such as an operational amplifier, a bipolar junction transistor (BJT), a field-effect transistor (FET) or other discrete transistor, a vacuum tube, a RF amplifier, and the like. Oscillation may be initiated in the amplifying circuit 104 in response to electrical noise and/or a desired signal. The oscillation may be terminated periodically in response to the magnitude of the input signal. A resonant circuit 108, which may be configured to be a feedback circuit, may be coupled in parallel with the amplifying circuit 104 to control a frequency of operation. In the embodiment of FIG. 1, the resonant circuit 108 may include a series LC circuit, wherein the L and C values may be selected to have a resonant frequency corresponding to the frequency of operation of the logarithmic detector 100. The oscillations may be set up in the amplifying circuit 104 at the frequency determined by the L and C values. Thus, noise outside of the LC resonance may have a minimal effect on the operation of the LC circuit. Input signals within the bandwidth of the LC resonance may commence oscillation more rapidly than random noise alone. The factor of merit or factor Q of the circuit may be determined mostly by the components used in the resonant circuit 108. A high-Q circuit may be achieved by use of a crystal resonator, for example, within the resonant circuit 108. Frequency selectivity, the skirt ratio, overall LDA regeneration, and factor Q may also depend on other parameters, such as instantaneous gain, one-cycle quenching gain, F_rep frequency, the value of capacitor C1 in FIG. 5, and the amplifier's input bias level (voltage or current), among other possible parameters.

A sampling circuit 112 may be coupled to the amplifying circuit 104. The sampling circuit 112 may be configured to effectively sample the current flowing in the voltage supply line to the amplifying circuit 104; once a predetermined threshold is reached, the sampling circuit 112 may act to cease the oscillation. That is, the sampling circuit 112 may be used to periodically interrupt the oscillation each time when the threshold is reached. A frequency to voltage convertor 116 may be coupled to the sampling circuit 112. The input to the frequency to voltage convertor 116 may include a series of voltage spikes, denoted as F_rep as further described herein, the frequency of which may vary substantially as the logarithm of the power of the input signal. The OUTPUT from the frequency to voltage convertor 116 may be a DC voltage that is proportional to the frequency of the input spikes.

In the case where the input signal is modulated, the OUTPUT of the frequency to voltage converter 116 may include a DC voltage component and an AC voltage component. The AC component may correspond to the input modulation and effectively be a copy of the demodulated input signal in baseband.

Figure 2:
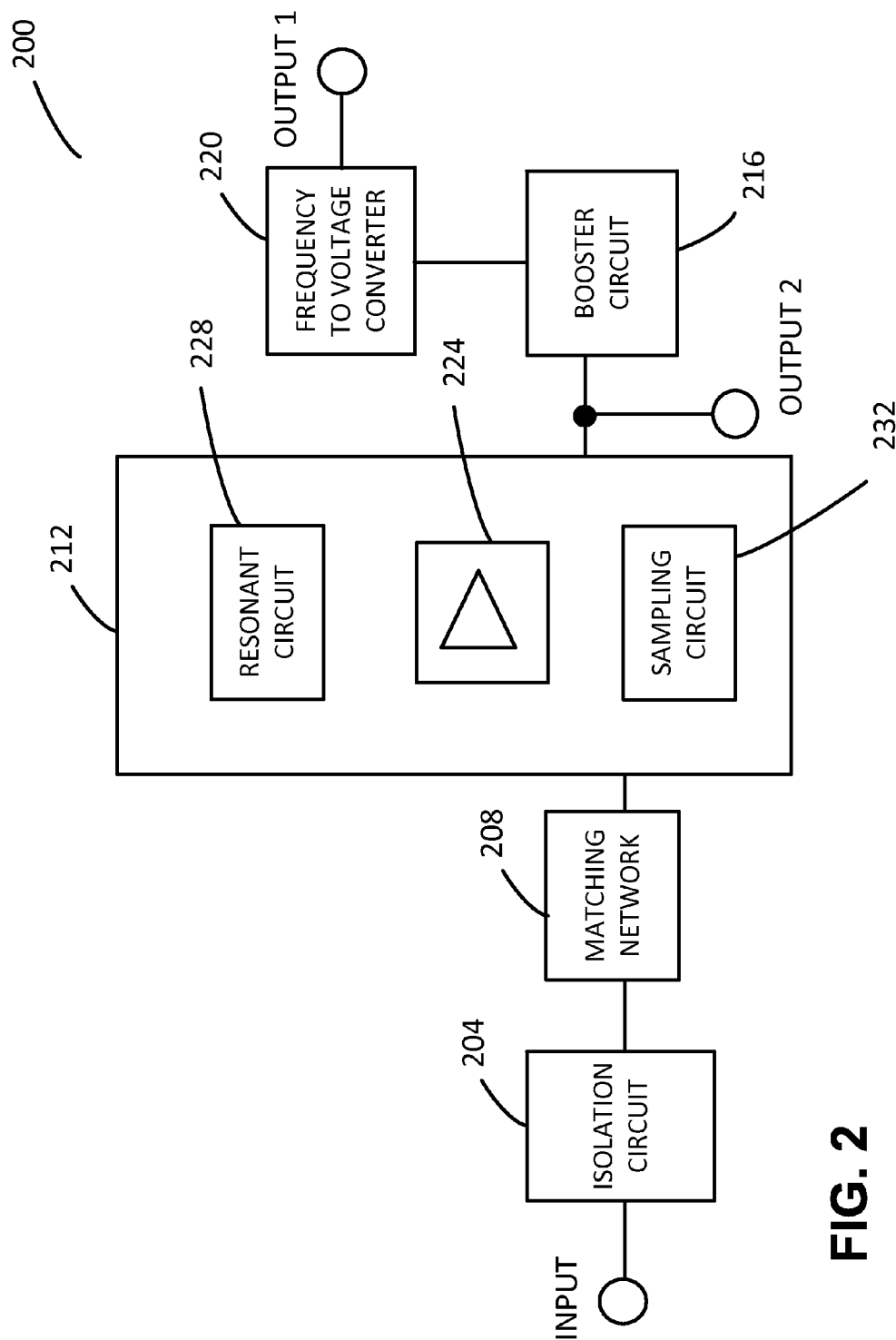
FIG. 2 is a block diagram illustrating an embodiment of an LDA system.

The embodiment of the logarithmic detector explained above may be adapted in a variety of ways to be implemented for various electronics applications. A logarithmic detector amplifier (LDA) system may be provided with certain basic properties and may be modified for suitable performance enhancement in target applications. FIG. 2 is a block diagram illustrating an embodiment 200 of an LDA system. The LDA system 200 may include an isolation circuit 204, a matching network 208, an LDA core 212, a booster circuit 216, and a frequency to voltage converter 220. The output may be coupled to the frequency to voltage converter 220 in this example, as labeled OUTPUT 1. The booster circuit 216 and/or the frequency to voltage converter 220 may be optional elements; one of them or both may be omitted depending on the target application. When the LDA system 200 does not include the booster circuit 216 and the frequency to voltage converter 220, the output port may be placed directly off the LDA core 212, as represented by OUTPUT 2 in FIG. 2. The LDA core 212 may include an amplifying circuit 224, a resonant circuit 228, and a sampling circuit 232, which may be configured to operate and function similarly to the amplifying circuit 104, the resonant circuit 108, and the sampling circuit 112 of the logarithmic detector 100 of FIG. 1.

The isolation circuit 204 may be used to filter out power leaks, reflected signals from the LDA core 212, and other interference effects from the surrounding circuits, in particular the Tx chain, to protect the Rx chain and optimize regeneration. In particular, signals reflected back from the LDA core input to the isolation circuit 204 with an unknown phase relative to the input signal may have a detrimental effect on signal regeneration when the regeneration buildup process is synchronous. With a reflected, out of phase signal mixing with the input signal, the regeneration process cannot be achieved as desired and poor performance may result.

Leaked power may also find a way into the receiver input, likely an antenna, and be radiated as unwanted emission or EMI. The isolation circuit 204 may include a circulator for such isolation purposes. A circulator in the Rx chain may be configured to pass the Rx signals and short out unwanted leaks and reflections to ground. A typical circulator includes a ferromagnetic element, such as ferrite, to correct non-linearity. However, ferromagnetic elements are generally bulky and expensive. Other types of circulators may include nano-ferromagnetic structures and metamaterials that permit a significant size reduction. Instead of a circulator, the isolation circuit 204 may be configured to have a low noise amplifier (LNA) or any passive or active device, which may provide enhanced gain (for an active circuit), improved isolation, signal-to-noise ratio, and bandwidth. If attenuation of the input signal and/or reduction of noise figure are permitted, a resistive attenuator, a resistive splitter, a Wilkinson splitter, or a coupler may be used. The matching network 208 may be used for impedance matching and/or phase correction purposes. Based on a mechanism similar to the one explained with reference to FIG. 1, the LDA core 212 may output a series of voltage spikes, F_rep, the frequency of which varies substantially as the logarithm of the power of the input signal. The signal F_rep may be outputted from OUTPUT 2 or sent to the booster circuit 216 and/or the frequency to voltage converter 220 to be further processed and outputted from OUTPUT 1. The booster circuit 216 may include one or more transistors or any other suitable amplifying components to amplify the signal F_rep, for example, from about 100 mV to several Volts. The booster circuit may further include a Schmidt trigger circuit or any simple digital circuit, such as a digital inverter, to digitize the amplified F_rep to obtain cleaner and sharper spikes. The output signal from the booster circuit 216 may be sent to the frequency to voltage converter 220, where the signal is converted to a DC plus AC voltage, such as in an audio range, to be outputted from OUTPUT 1.

As mentioned earlier, the LDA system 200 may include certain basic properties of the logarithmic detector as illustrated in FIG. 1, as well as suitable performance enhancements for target applications. For example, the frequency of operation may be determined by selecting the L and C values in the resonant circuit; therefore, in conjunction with the LDA core amplifying circuit, high out-of-band rejection, high skirt ratio, and high signal-to-noise ratio may be achieved by using the LDA system 200 as variously modified. That is, the LDA system 200 may be implemented for highly frequency-selective applications. Furthermore, the sampling circuit may be used to periodically interrupt the oscillation each time when the threshold is reached, providing a self-quenching and time-dependent sampling function. Thus, the regeneration properties of the oscillations may be enhanced by the low instantaneous regenerative gain of the amplifying circuit and the clamping and restarting of the oscillations, giving rise to high Rx sensitivity. The low instantaneous regenerative gain of the amplifying circuit may be in the range of 1-5 in embodiments. However, the LDA gain over an entire cycle of regeneration may be substantially higher. In general it may be low to high and for instance in a range of −10 dB to +50 dB. As compared to a typical LNA, the signal-to-noise ratio may be enhanced, and the output received signal strength indicator (RSSI) level may become higher. This may be an advantage for the receive stages that follow or the communication device with which the LDA system 200 is used since less or no further amplification may be required. The LDA's Rx sensitivity may be increased by reducing the frequency bandwidth of the LDA core that may be achieved by using high Q components in the resonant circuit, such as capacitors, inductors, SAW filters, BAW filters, ceramic resonators, mechanic resonators, etc. The high Q values for inductors and capacitors may be in the range of 25-200 in embodiments. In particular, the high Q values for a SAW filter, a BAW filter, a ceramic filter, and a mechanic filter may be in the range of 500-20,000.

Embodiments may be able to regenerate a weak to strong receive signal and amplify it selectively with minimal noise addition without any conversion of frequency that is usually associated with logarithmic amplifiers.

Figure 3:
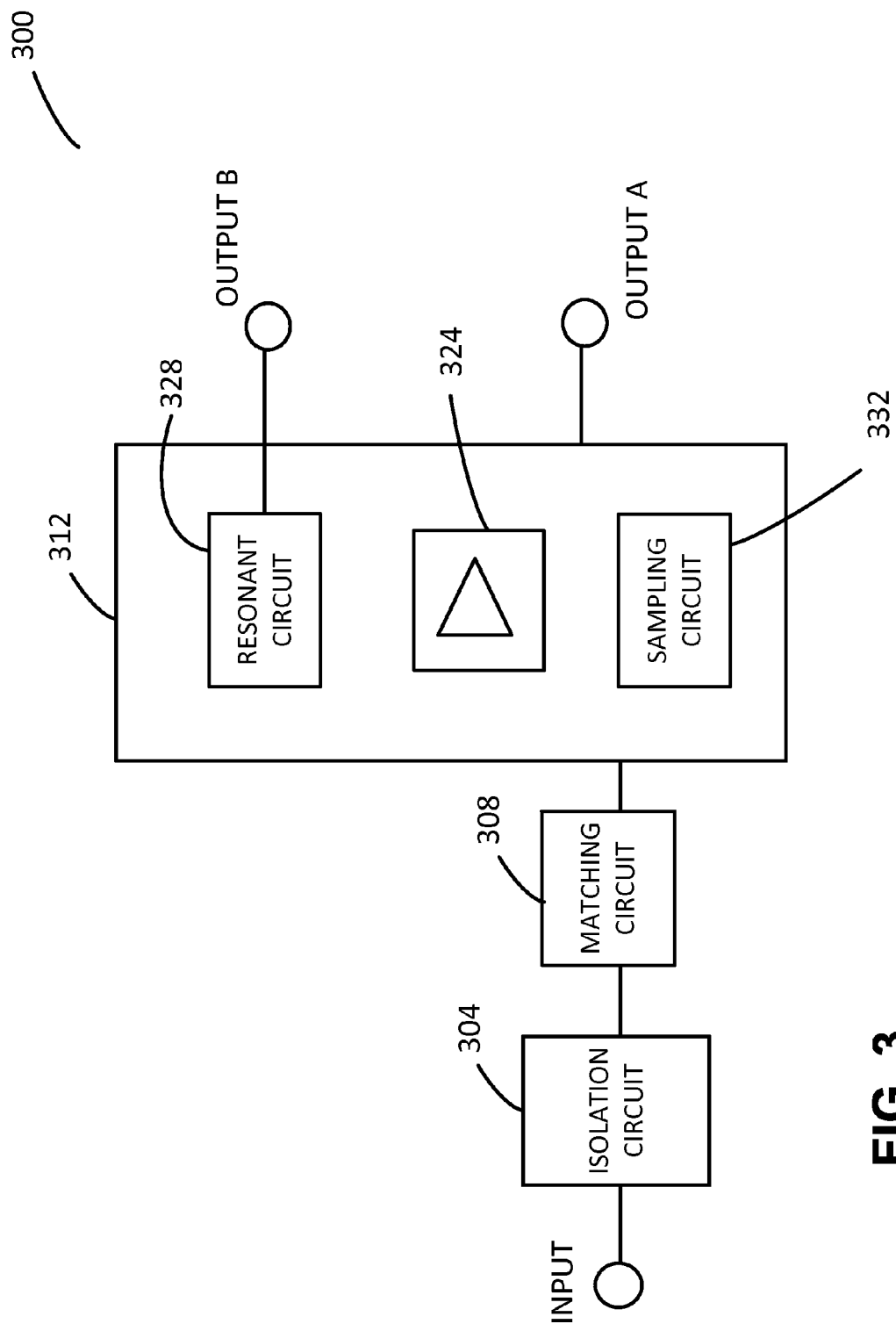
FIG. 3 is a block diagram illustrating another embodiment of an LDA system.

FIG. 3 is a block diagram illustrating another embodiment 300 of an LDA system. The LDA system 300 may include an isolation circuit 304, a matching network 308, and an LDA core 312. The LDA core 312 may include an amplifying circuit 324, a resonant circuit 328, and a sampling circuit 332, which are configured to operate and function similarly to the amplifying circuit 104, the resonant circuit 108, and the sampling circuit 112 of the logarithmic detector 100 of FIG. 1. OUTPUT A is equivalent to OUTPUT 2 of FIG. 2, where the LDA core 312 may output a series of voltage spikes, F_rep. Alternatively, the F_rep may be left open here without being outputted. In the example 300 of the LDA system, the resonant circuit 328 may be configured to output RF signals through OUTPUT B. The signal on OUTPUT B may be a substantially regenerated copy of the input signal for which the power level is higher, but the frequency substantially the same, except that the output signal may be sampled in time at a rate of the quenching frequency. Due to the time sampling, the frequency spectrum may look repetitive. In some cases, the quenching frequency pulses may be so little that the system acts as if not a quenching frequency and the output signal on OUTPUT B may appear continuous in time.

The isolation circuit 304 may be used to filter out power leaks, reflected signals and other interference effects from the surrounding circuits, in particular the Tx chain, to protect the Rx chain and as explained earlier to avoid the reduction of regeneration efficiency or radiated power leaks as EMI. The isolation circuit 304 may include a circulator for isolation purposes. Such a circulator in the Rx chain may be configured to pass the Rx signals and short out unwanted leaks and reflections to ground. A typical circulator may include a ferromagnetic element, such as ferrite, to correct non-linearity. However, ferromagnetic elements are generally bulky and expensive. Other types of circulators may include nano-ferromagnetic structures and metamaterials that permit a significant reduction in size. Instead of a circulator, the isolation circuit 304 may be configured to have an LNA, or any passive or active device, which may provide enhanced gain (for an active circuit), isolation, signal-to-noise ratio, and bandwidth.

The matching network 308 may be used for impedance matching and/or phase correction purposes. Based on the mechanism similar to the one explained with reference to FIG. 1, the LDA core 312 may output a series of voltage spikes, F_rep. The F_rep may be outputted from OUTPUT A or simply left open without being outputted.

Figure 4:
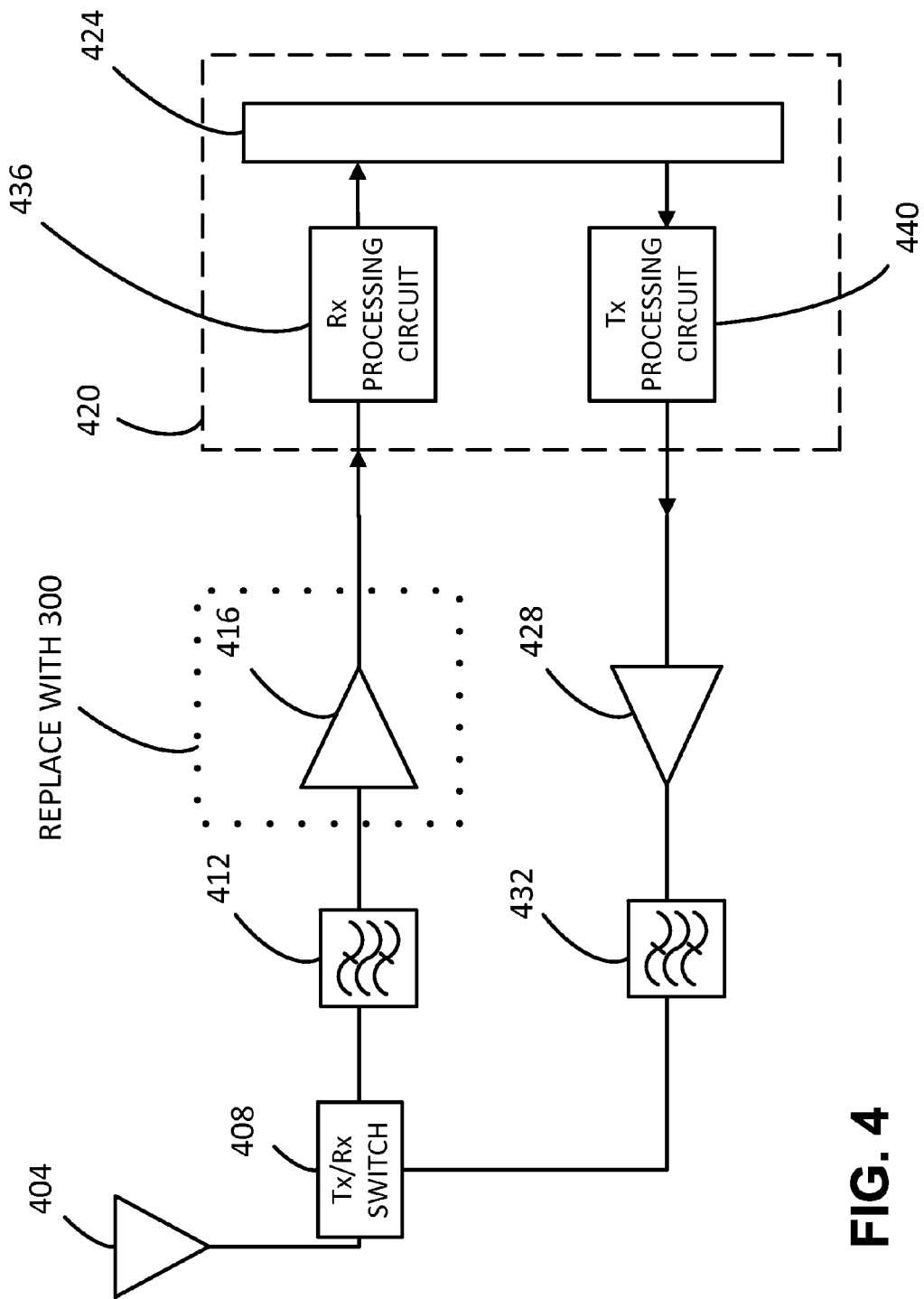
FIG. 4 illustrates a first embodiment of a communication device for transmitting and receiving RF signals where the low noise amplifier (LNA) is replaced with the LDA system.

By configuring the resonant circuit 328 so as to output RF signals through OUTPUT B, the LDA system as illustrated in FIG. 3 may be implemented for various RF applications, while providing enhanced performance levels as compared to conventional RF communication devices. A substantial difference between the circuit of FIG. 3 and the circuit of FIG. 1 is that OUTPUT B in FIG. 3 carries a substantially identical frequency spectrum around the central frequency (ratio range of substantially 0.05% to 20%), and at substantially the same central frequency, versus the INPUT signal. There is no frequency shift between the INPUT and OUTPUT B, but there is a significant difference between the frequency of the INPUT and OUTPUT A, with a frequency ratio in the range of substantially 0.01% to 10%. However, OUTPUT A may carry a substantially identical frequency spectrum around the central frequency of the INPUT versus the INPUT, but at a different frequency, such as a lower intermediate frequency (IF). F_rep shall be greater than the INPUT frequency spectrum in order for the frequency spectrum to be substantially identical on OUTPUT A versus the INPUT. For instance, the INPUT frequency signal may be a 500 MHz sine wave that carries a BPSK modulation of 1 Mbps occupying 1.5 MHz. The LDA may be designed to provide a frequency of 500 MHz on OUTPUT B that carries the 1.5 MHz BPSK modulation while OUTPUT A carries a repetition frequency F_rep of 5 MHz with a BSPK modulation of 1.5 MHz. FIG. 4 illustrates an embodiment of a conventional communication device for transmitting and receiving RF signals. A single antenna 404 may be used in this example for both transmit (Tx) and receive (Rx) modes. A Tx/Rx switch 408 may be coupled to the antenna 404 to select either the Tx chain or the Rx chain depending on the mode during the time interval. The Rx chain typically may have an Rx filter 412 and an LNA 416. An additional Rx filter may be added either before or after the LNA 416 or both depending on the filtering level and the frequency range. An LNA may generally be used to amplify the Rx signal while adding as little noise and distortion as possible to increase sensitivity. The Rx signal may be amplified and outputted from the LNA 416 to a transceiver 420 to eventually reach a baseband processor 424, such as a modem. The Tx chain may have a power amplifier (PA) 428 and a Tx filter 432. An additional Tx filter may be added either before or after the PA 428 or both depending on the filtering level and the frequency range. The Tx signal outputted from the transceiver 420 may be sent to the PA 428, where the Tx signal may be amplified and outputted to the Tx filter 432, as illustrated in this embodiment, and sent to the antenna 404. The transceiver 420 may include various circuits to process the RF signals. These circuits are represented in FIG. 4, as an Rx signal processing circuit 436 for the Rx chain and a Tx signal processing circuit 440 for the Tx chain. The Rx signal processing circuit 436 may include a down converter for down-converting the frequency, a demodulator for demodulating the modulated signal, an analog to digital converter to generate digital signals to be inputted to the baseband processor 424, and a synchronization function for synchronizing in time the incoming symbol data stream from the remote transmitter and with the receiver.

In the conventional RF communication device such as illustrated in FIG. 4, the LNA 416 amplifies the Rx signal while, typically, adding as little noise and distortion as possible. As explained earlier, the LDA system can provide amplified signals while minimizing unwanted noise. Therefore, a new type of RF communication device with enhanced performance levels may be provided by replacing the LNA 416 with the LDA system 300 by coupling the RF output, OUTPUT B, to the transceiver 420, as indicated with the dotted box in FIG. 4. Alternatively, the LDA system may be added as the first amplification stage as a receive sensitivity booster to complement the LNA. The Rx filter 412 and other components may also be included in the LDA system. In an embodiment, the Rx filter 412 may be removed or significantly relaxed (i.e. lower order, less frequency out-band rejection, and more affordable) because the LDA is frequency selective and acts as an active filtering device with high skirt ratio. In the case where the communication device is a WiFi system, the RF signal at about 2.4 GHz may be amplified by the LDA system 300 and outputted into the transceiver 420, which includes a down converter. A typical down converter converts a digitized signal centered at an intermediate frequency to a baseband signal centered at very low frequency. Therefore, by taking the RF Rx signal at about 2.4 GHz from the RF output, OUTPUT B, of the LDA system 300, the existing transceiver technology, including a down converter, may be used without modification to obtain the down converted signal on the order of 20 MHz to 40 MHz for WiFi (IEEE 802.11b to 802.11n) before sending the signal to the baseband processor 424.

Other applications may concern sub-1 GHz narrow band transceivers for use at 168 MHz, 433 MHz or 868 MHz, where the modulated signal bandwidth may be as low a few KHz.

Yet other applications may concern satellite communication, for instance, GPS at 1.5 GHz, where the received radio signal is at a very low power level. The LDA may be a candidate as a receive booster for such very low received levels and relative low data rate applications.

Yet other applications may concern a very high frequency such as the 60 GHz band where a simple electronic topology with very fast transistors is needed. The 60 GHz CMOS process may be used to design such a receive booster or an LNA replacement to provide very sensitive receivers.

Yet other applications may concern WLAN communication standards, such as IEEE 802.11a-c (with 20 MHz to 160 MHz bandwidth at 5-6 GHz), BLUETOOTH, Z-Wave, Zigbee, DECT, DECT 6.0, DECT at 2.5 GHz, and so on.

Yet other applications may concern cellular communication standards, such as AMPS, PCS, Global System for Mobile Communications (GSM), General Packet Radio Service (GPRS), CDMA, IS-95, cdmaOne, CDMA2000, Evolution-Data Optimized (EV-DO), Enhanced Data Rates for GSM Evolution (EDGE), Universal Mobile Telecommunications System (UMTS), Digital AMPS (IS-136/TDMA), and Integrated Digital Enhanced Network (iDEN), 3G, 4G, WIMAX, LTE in various frequency bands from a few 100 MHz to a few GHz.

Yet other applications may pertain to various modulated communication signals transmitted from a wireless or wired system through cable, a power wire, a telephone wire, a fiber optic, and so on where the power of the carrier and/or the modulated signal is desired to be amplified with high sensitivity and with low addition of noise and further processed by a receiver unit.

The LDA system in FIG. 3 may amplify either a CW RF signal (un-modulated) or an RF carrier signal with a modulation signal. The modulation signal may be either analog amplitude, frequency modulation or phase modulation, respectively abbreviated as AM, FM, PM, or digital modulation such as ASK, OOK, quadrature m-AM, FSK, MSK, GFSK, GMSK, 4-FSK, 4GMSK, m-FSK, PSK, QPSK, m-QAM, all of which are abbreviations known in the art for different types of modulation. More complex modulations may be used, such as FH-SS, DS-SS, OFDM, MIMO N×N with BPSK, QPSK, m-QAM, and OFDM, which are also abbreviations known in the art. In a general sense, the LDA system 300, as illustrated in FIG. 3, regenerates and amplifies with high receive sensitivity and low noise figure the input signals from INPUT within its regeneration frequency bandwidth, and outputs the signals without frequency conversion (i.e., with same frequency, same spectrum) on OUTPUT B. This includes carrier and modulation.

As mentioned earlier, the LDA system 300 may be implemented in the communication device of FIG. 4 as a receive booster, not by replacing the LNA 416, but rather by adding the LDA system 300 in a complimentary fashion within the receive path between blocks 412 and 416. In this configuration the receive sensitivity may be increased by virtue of the LDA high receive sensitivity, low noise figure, and amplification.

In another embodiment, the filter 412 may be removed since the LDA system may be a selective frequency circuit due to a pulsed oscillator and amplifier that has an increased skirt ratio. This may replace the filter 412 and even exceed the out-of-band rejection performance.

Figure 5:
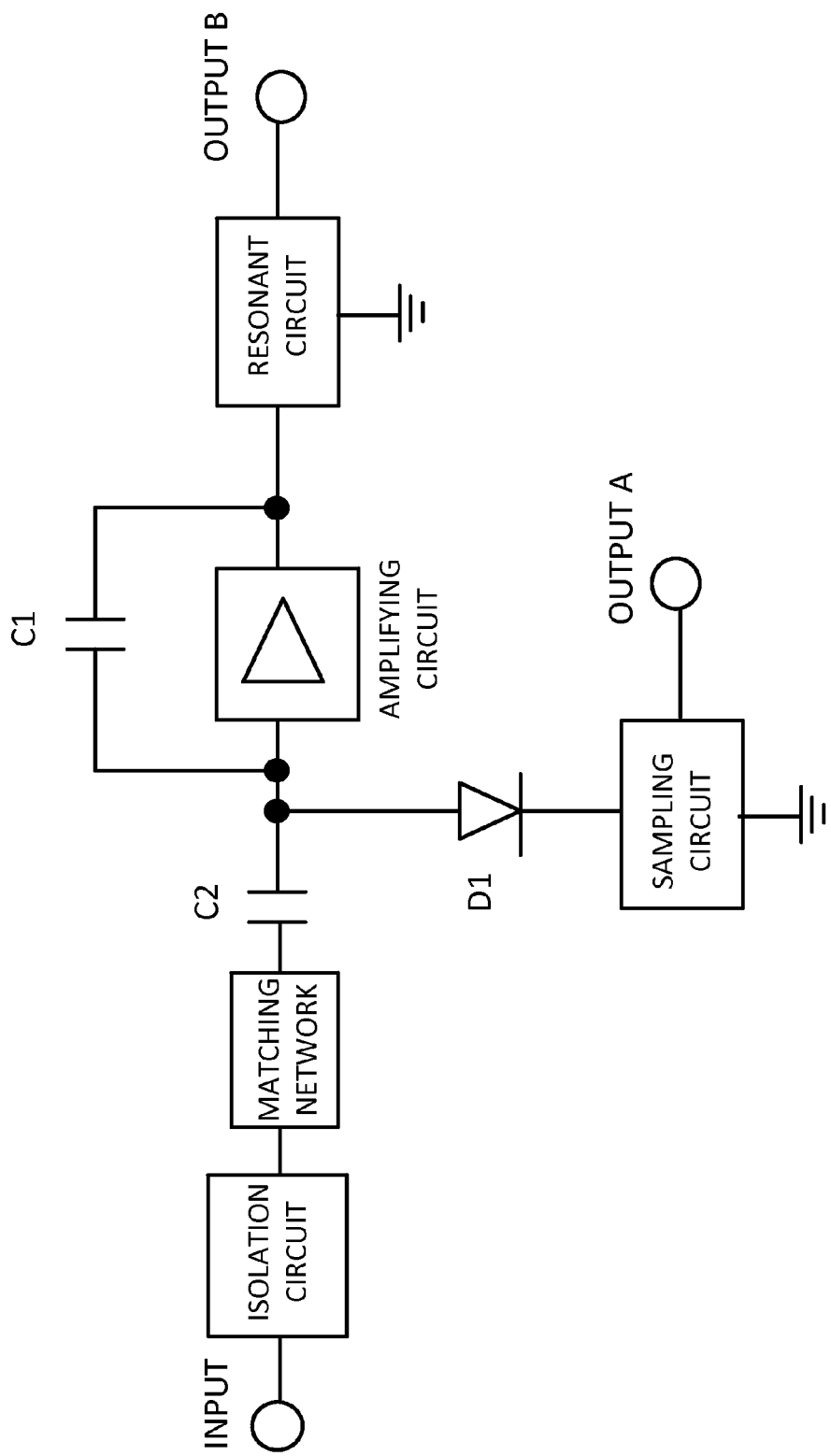
FIG. 5 illustrates an embodiment of a circuit configuration of the LDA system.

FIG. 5 illustrates an embodiment of a circuit configuration of the LDA system 300. The isolation circuit may be coupled to the input port and used to filter out power leaks, reflected signals, and other interference effects from the surrounding circuits to protect the Rx chain, and as explained earlier to avoid the reduction of regeneration efficiency or radiated power leaks as EMI. The isolation circuit may include a circulator for the isolation purpose. Older types of circulators tend to be bulky and include expensive ferromagnetic elements. New types of circulators may include nano-ferromagnetic structures and metamaterials that permit significant reductions in size. Instead of a circulator, the isolation circuit may be configured to have an LNA, or any passive or active device, which may provide enhanced gain (for an active circuit), isolation, signal-to-noise ratio, and bandwidth. The matching network may be used for impedance matching and/or phase correction purposes. The matching network may be critically coupled to the input section of the amplifying circuit, via a capacitor C2 in this embodiment. Under-coupled coupling may affect the regeneration process adversely because not enough input energy is injected in the LDA. In the opposite case where the system is over-coupled, the regeneration may also be affected because too much input energy is transferred to the LDA. The amplifying circuit may be configured to amplify the input signal and may include any suitable amplifying element, such as an operational amplifier, a BJT, a FET, an RF amplifier, or other discrete transistor.

In the logarithmic detector in FIG. 1, the resonant circuit 108 may be coupled in parallel with the amplifying circuit 104, forming a feedback loop. In contrast, the LDA system of FIG. 5 may include the resonant circuit coupled in series with the amplifying circuit at the output side of the amplifying circuit, and a capacitor C1 coupled in parallel with the amplifying circuit. Alternatively, the resonant circuit may be coupled in series with the amplifying circuit at the input side of the amplifying circuit. The frequency of operation may be set by choosing L values and C values in the resonant circuit. The oscillations may be set up in the amplifying circuit at the frequency so determined. The sampling circuit may be coupled to the amplifying circuit through a diode D1 in this embodiment. The sampling circuit may be configured to effectively sample the current flowing in the voltage supply line to the amplifying circuit; once a predetermined threshold is reached, the sampling circuit may act to cease the oscillation. That is, the sampling circuit may be used to periodically interrupt the oscillation each time when the threshold is reached. Similar to the logarithmic detector illustrated in FIG. 1, the output from the sampling circuit may thus be a series of voltage spikes, F_rep. The F_rep may be outputted from OUTPUT A or simply terminated without being outputted.

Figure 6:
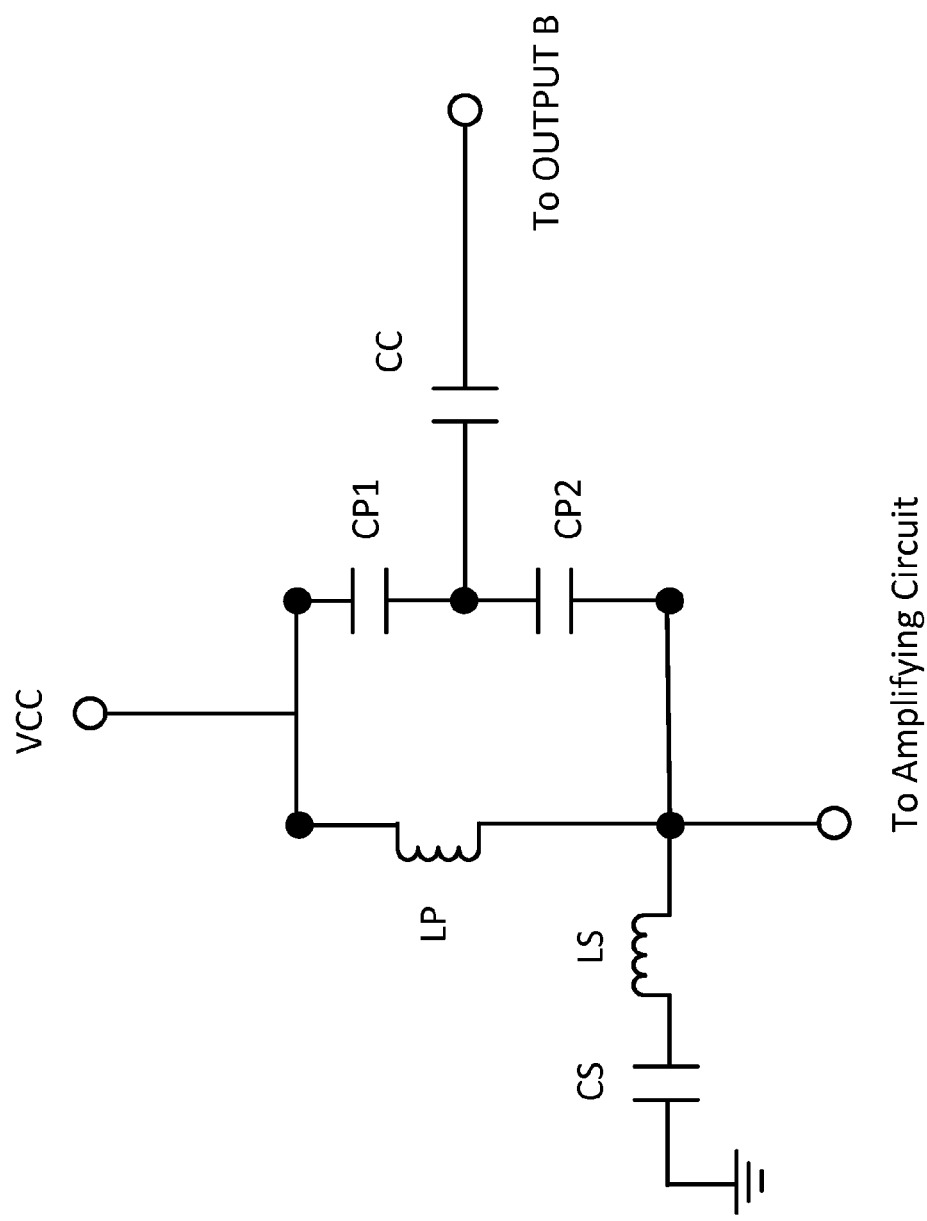
FIG. 6 illustrates an embodiment of a resonant circuit for outputting RF signals without affecting the LDA properties.

To output signals at the RF frequency without affecting the properties of the LDA system, the resonant circuit of the LDA system in FIG. 3 or FIG. 5 may be configured differently from the resonant circuit 228 of the LDA system 200 in FIG. 2. There may be various techniques that may be employed to achieve this goal. FIG. 6 illustrates an embodiment of a resonant circuit for outputting RF signals without affecting the LDA properties. This resonant circuit may include two main parts: a series resonant circuit portion and a parallel resonant circuit portion. In this figure, VCC represents a DC voltage supply, the input port of the resonant circuit may be configured to be coupled to the amplifying circuit, and the output port may be coupled to OUTPUT B for outputting RF signals. The series resonant portion may include a capacitor CS and an inductor LS, providing a series resonance. The parallel resonant circuit portion may include an inductor LP in parallel with split capacitors CP1 and CP2 and a third capacitor CC coupled to the common node of CP1 and CP2. By determining the values of CP1, CP2, and CC so as to critically couple each other and optimize for the output impedance, the RF signal may be optimally tapped out. Furthermore, some of the inductors and the capacitors in the parallel resonant circuit portion may be configured to be high Q inductors and high Q capacitors in order to have a small bandwidth with enhanced sensitivity. Bandwidth may be further determined by the instantaneous amplifier gain as well as the one-cycle quenching gain. Amplifier gain may be typically set by the capacitor C1 in FIG. 5 and the bias level (voltage or current) of the amplifier.

Figure 7A:
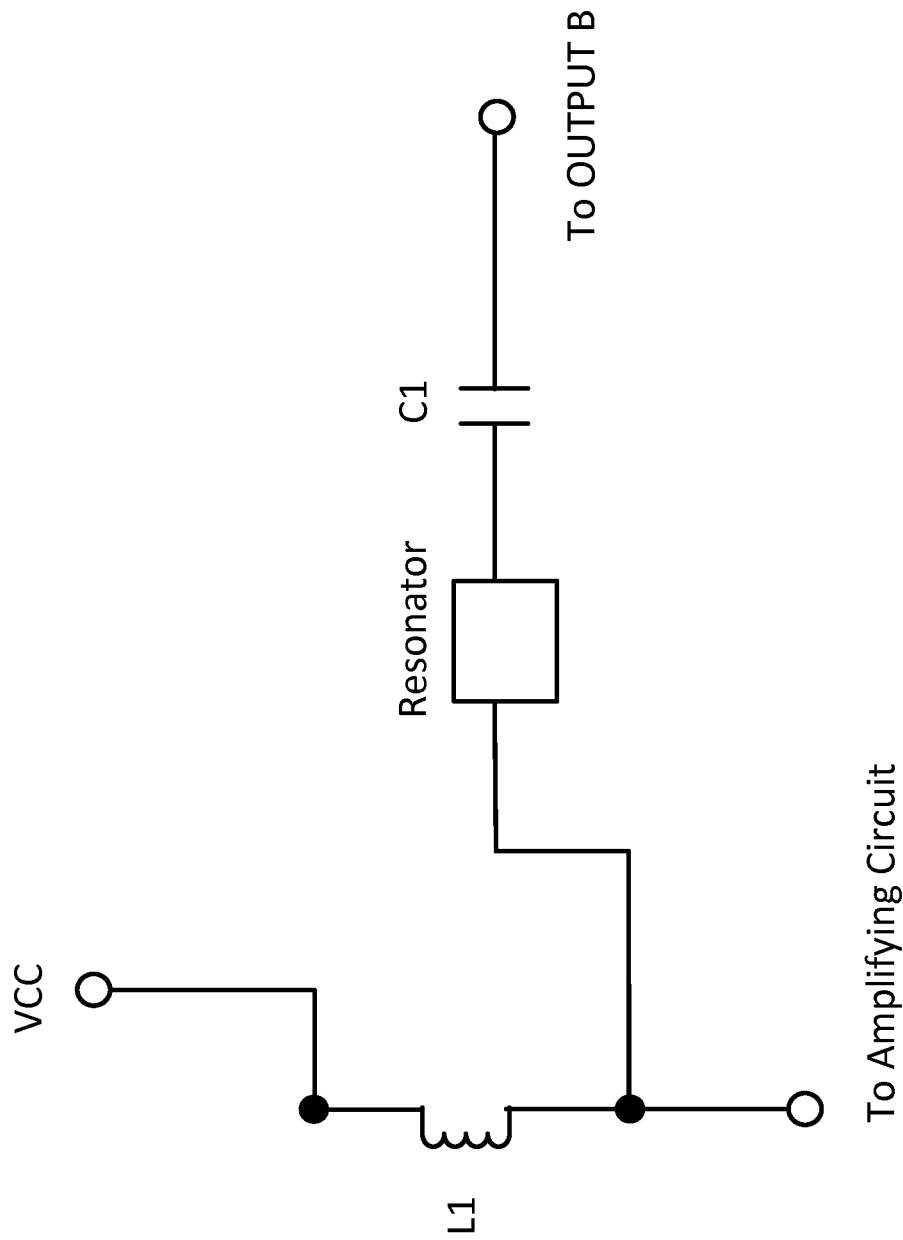
FIG. 7A illustrates another embodiment of a resonant circuit for outputting RF signals without affecting the LDA properties.

FIG. 7A illustrates another embodiment of a resonant circuit for outputting RF signals without affecting the LDA properties. In this figure, VCC represents a DC voltage supply, the input port of the resonant circuit may be configured to be coupled to the amplifying circuit, and the output port may be coupled to OUTPUT B for outputting RF signals. This resonant circuit may include an inductor L1 coupled to VCC, a capacitor C1 coupled to OUTPUT B, and a resonator on the output branch. The resonator may include a surface acoustic wave (SAW) filter, a bulk acoustic wave (BAW) filter, or a crystal filter for passing signals with RF frequencies, as well as a ceramic filter, a mechanical filter, an LC resonator, an active RC, a variation of RC or LC where C is replaced with a variable capacitor, or an active component with variable capacitance.

Figure 7B:
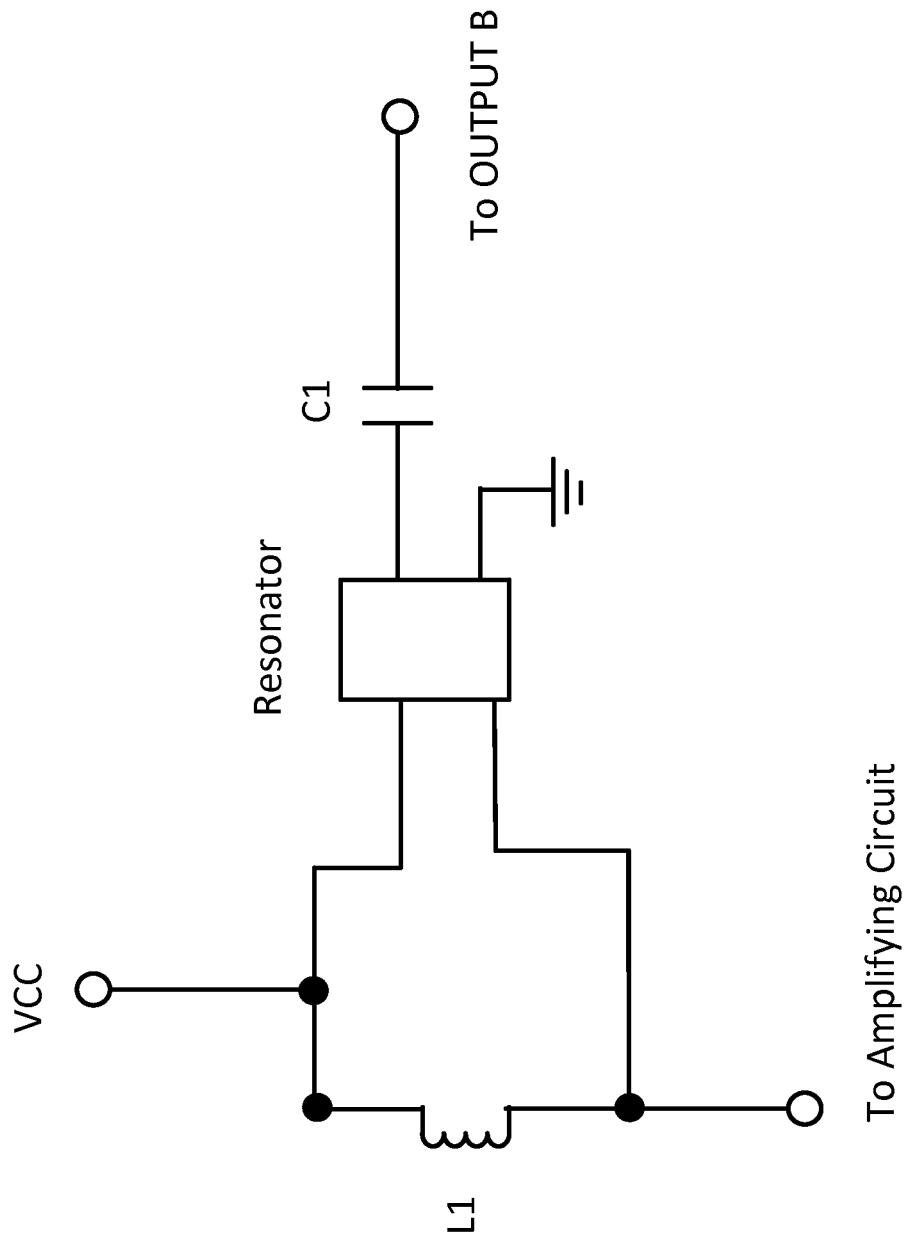
FIG. 7B illustrates an embodiment of a resonant circuit having a differential input and a differential output for outputting RF signals without affecting the LDA properties.

FIG. 7B illustrates another embodiment of a resonant circuit for outputting RF signals without affecting the LDA properties, where a differential input/output resonator may be used. In this figure, VCC represents a DC voltage supply; one of the input ports of the resonant circuit may be configured to be coupled to the amplifying circuit, the other to VCC. One of the output ports may be coupled to OUTPUT B for outputting RF signals, while the second output may be grounded. This resonant circuit may include an inductor L1 coupled to VCC, a capacitor C1 coupled to OUTPUT B, and a resonator with the differential input/output on the output branch. The resonator may be a surface acoustic wave (SAW) filter, a bulk acoustic wave (BAW), or a crystal filter for passing signals with RF frequencies.

Three embodiments of resonant circuit configurations are described in FIGS. 6, 7A, and 7B above. In each configuration, the output branch may additionally include an isolator, e.g., an LNA having a low to medium gain, so as to enhance the system isolation. In additional embodiments, the output branch may include a 50Ω pad. Alternative to the split capacitor CP1, CP2 configuration as illustrated in FIG. 6, the inductor LP may be split to LP1 and LP2, which may be coupled together with a mutual inductance. In this configuration, the RF output signal may be tapped onto one output node of LP2, while the second node may be connected to ground in a single ended configuration. Some of these and other methods may be combined to configure the resonant circuit for optimally outputting RF signals without affecting the LDA properties.

Figure 8:
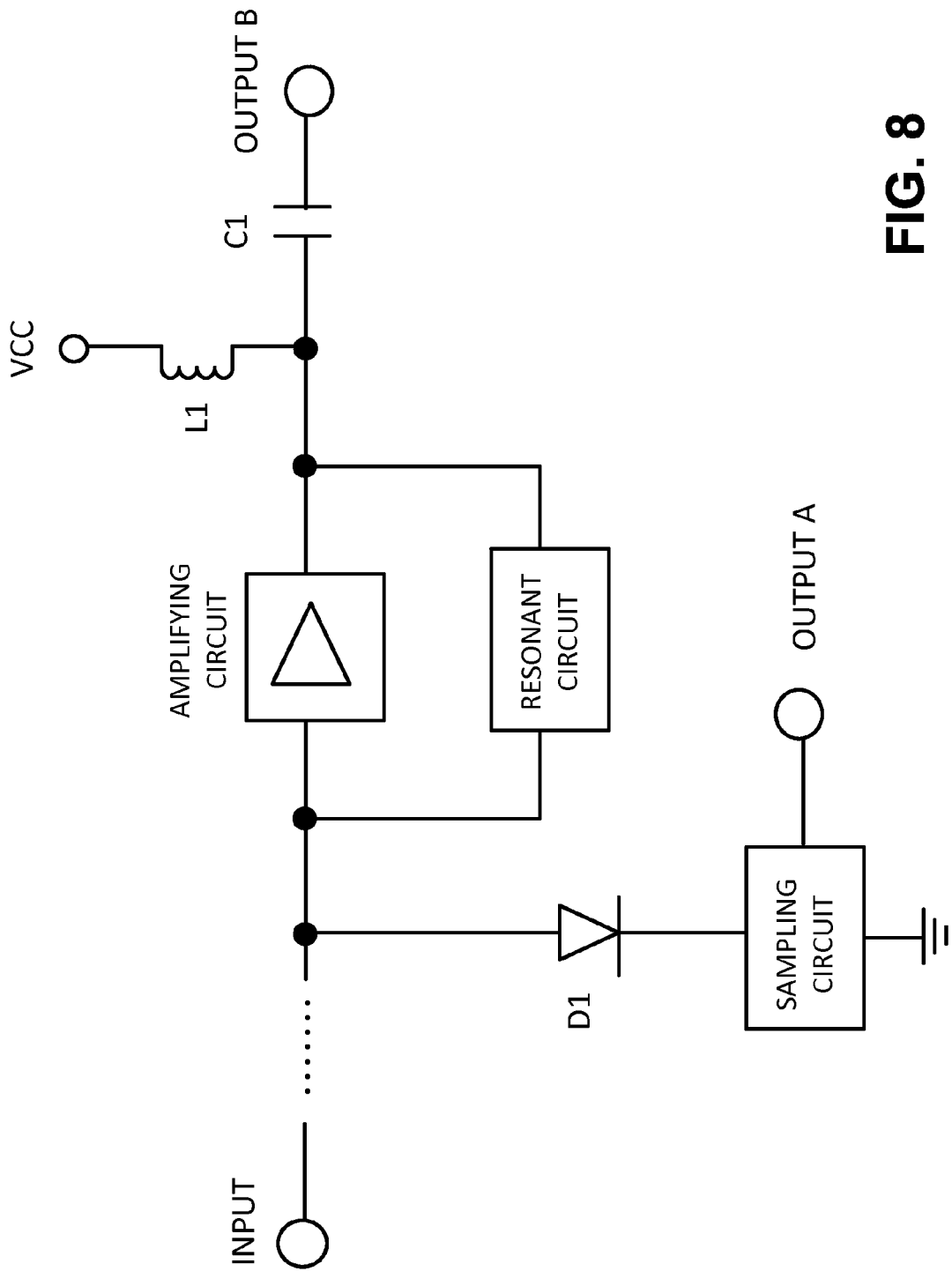
FIG. 8 illustrates another embodiment of a circuit configuration of the LDA system, where the resonator circuit is coupled in parallel with the amplifying circuit as a feedback circuit.

Referring back to FIG. 5, the LDA system may include the resonant circuit coupled in series with the amplifying circuit at the output side of the amplifying circuit. It should be noted that the resonant circuit may be coupled in series with the amplifying circuit at the input side of the amplifying circuit. FIG. 8 illustrates another embodiment of a circuit configuration of the LDA system 300, where the resonant circuit may be coupled in parallel with the amplifying circuit as a feedback circuit. The resonant circuit may be configured to be input/output single-ended or differential. The output side of the amplifying circuit may be coupled to VCC through a choke L1, and a capacitor C1 is coupled to OUTPUT B. The rest of the circuit may be similar to the one illustrated in FIG. 5. The resonant circuit may include an LC filter, a SAW filter, a BAW, a crystal filter, and so on for passing signals with RF frequencies. In the example of FIG. 8, VCC, L1, and C1 are shown as external elements to the resonant circuit.

Figure 9:
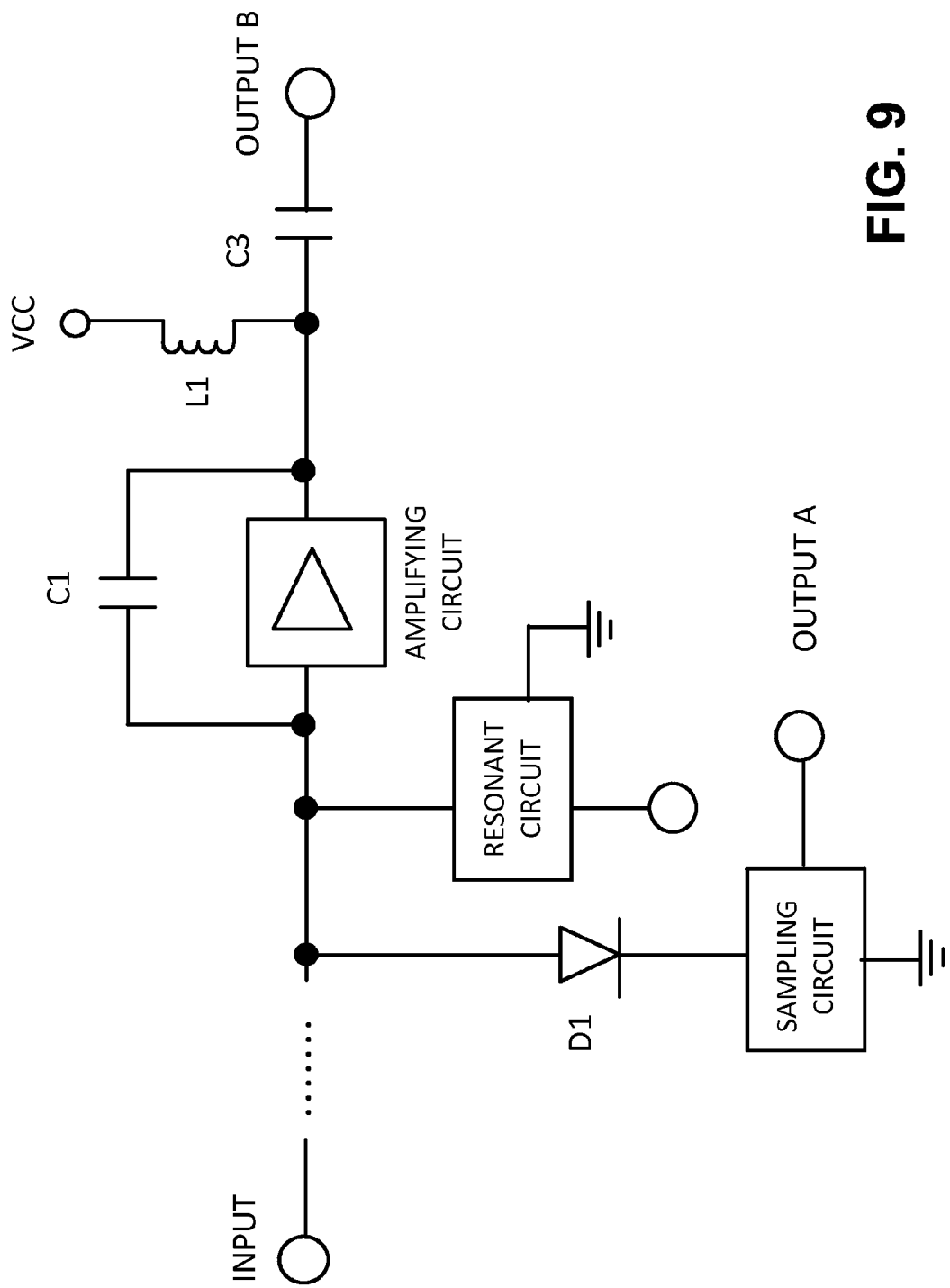
FIG. 9 illustrates another embodiment of a circuit configuration of the LDA system, where the resonator circuit is coupled in shunt with the amplifying circuit at the input side of the amplifying circuit.

FIG. 9 illustrates another embodiment of a circuit configuration of the LDA system, where the resonant circuit may be coupled in shunt with the amplifying circuit at the input side of the amplifying circuit. It should be noted that the resonant circuit may be coupled in shunt with the amplifying circuit at the output side of the amplifying circuit. The other end of the resonant circuit may be shorted to ground. The resonant circuit may be input/output single-ended or differential, and one of the outputs may be left open in order to not load the circuit. The output side of the amplifying circuit may be coupled to VCC through a choke L1, and a capacitor C3 may be coupled to OUTPUT B. The rest of the circuit may be similar to the one illustrated in FIG. 5. In the example of FIG. 9, VCC, L1, and C3 are shown as external elements to the resonant circuit.

One or more resonant circuits may be used in the LDA systems illustrated herein. At least one resonant circuit may be coupled in series with the amplifying circuit at the input side or output side of the amplifying circuit. Alternatively, at least one resonant circuit may be coupled in parallel with the amplifying circuit. Yet alternatively, at least one resonant circuit may be coupled in shunt with the amplifying circuit at the input side or output side of the amplifying circuit. Furthermore, a combination of series, shunt, and parallel configurations may be employed as well. Each of the resonant circuits may be configured to include one or more components selected from the group consisting of a SAW filter, a BAW filter, a crystal filter, a ceramic filter, a mechanical filter, an LC resonator, an active RC, or a variation of RC or LC where C is replaced with a variable capacitor, e.g., a varicap, or an active component with variable capacitance. Additionally, the matching network may be configured to be coupled to the input, the RF output, or both, or can be omitted. Similarly, the isolation circuit may be configured to be coupled to the input, the RF output, or both, or may be omitted.

Figure 10:
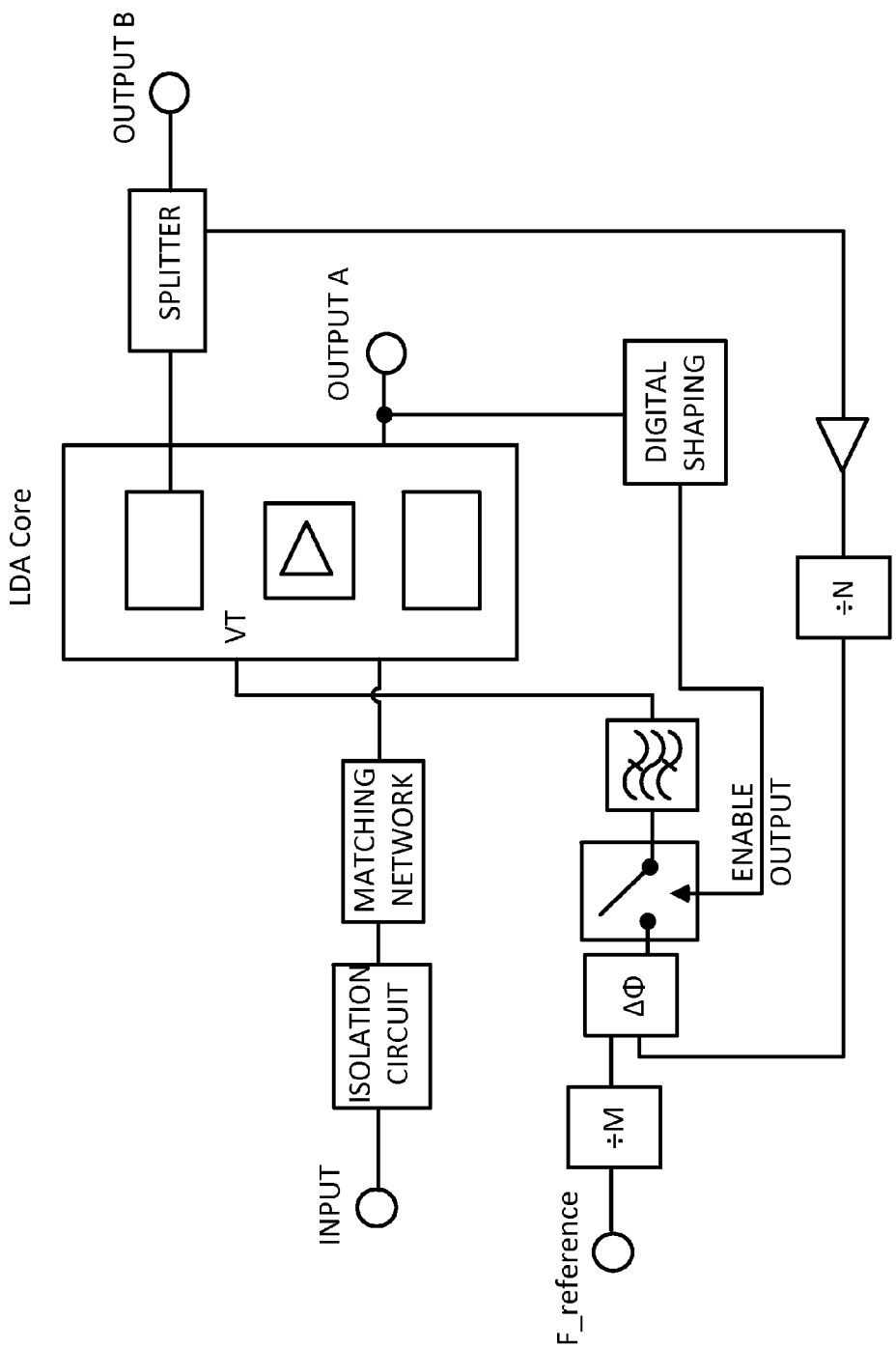
FIG. 10 illustrates an embodiment of a topology where the LDA system is implemented in a phase lock loop (PLL).

FIG. 10 illustrates an embodiment of a topology where the LDA system may be implemented in a phase lock loop (PLL). In FIG. 10, the schematic of FIG. 3 is modified to provide additional features, such as an adjustable capture frequency bandwidth that may be very narrow, the locking to a reference frequency that may be a particular channel in the frequency band of use, or where the reference frequency may be derived from the input carrier frequency with a "carrier extraction circuitry" (not shown here). The original OUTPUT B may be split into two by a power splitter: one may be the new OUTPUT B in FIG. 10, and the other may be the second output that passes an output signal through an amplifier or attenuator to feed a digital programmable or fix frequency divider by N. This divider per N may include a frequency prescaler, where the maximum frequency may be scaled up to microwave frequency. The resulting signal may be compared to the reference frequency, F_reference, divided by a factor M with the use of a phase/frequency comparator. The phase/frequency comparator may be analog or digital. The phase difference may be fed to a low-pass filter through a 3-state switch and a charge pump such that the output voltage is kept constant in the low pass filter when the switch is open. When the switch is closed, the charge pump injects positive or negative current pulses that decrease or increase the voltage at the output of the low pass filter. The output voltage of the filter may drive an input of the LDA core, VT, which may vary the oscillation frequency in a voltage controller oscillator mode, where the LDA input may be a variable capacitance diode or a varicap, for instance, in the resonant circuit or another LDA input node where the DC voltage changes the oscillation frequency. The input of the LDA core may be coupled through a matching circuit and an isolation circuit to INPUT. On the other side, the signal from OUTPUT A, which passes through a digital shaping circuit and an optional adjustable delay function, may drive the 3-state switch of the phase comparator. By adjusting the division ratio N and M, the capture bandwidth of the PLL and LDA may be changed, adjusted, or programmed. The loop bandwidth may be adjusted so as to be substantially slower than the lowest data rate. In that configuration, the PLL has a slow reaction time versus the data rate, and the data rate is not affected by the PLL loop trying to balance the phase and frequency difference. The modulated input or data rate may pass through the PLL without affecting it and may be regenerated without the PLL. The LDA's high receive sensitivity is not affected by the PLL, since the regeneration process is kept independent of the PLL.

A first application of LDA plus PLL may be to reduce the capture frequency bandwidth and reduce the frequency bandwidth to a particular channel of the band of use, for instance, channel 3 amongst 10 channels. This topology provides an electronically adjustable band pass filter function with an adjustable or fixed bandwidth. The LDA may be useful in such an application because of its high skirt ratio (left and right frequency edge sharpness) and the fact that it may help to increase the selectivity and unwanted interference rejection of the receiver. Locking the LDA in a PLL may also make it possible to correct frequency drift with temperature so that the default oscillation frequency of the LDA core may be in relation with (N/M)*F_reference.

Other configurations of the LDA and PLL may be devised to provide additional features. The reference frequency, F_reference, that drives the PLL phase comparator may be derived from a circuit that provides synchronization with the input receive symbol rate. By doing so, the LDA may provide one quenching per symbol and in synchronicity with it. This may help to reduce the F_rep frequency to the same value as the input modulation signal. In the opposite case, F_rep must be at least twice the input modulation to meet the Nyquist criteria.

While this document contains many specifics, these should not be construed as limitations on the scope of an invention or of what may be claimed, but rather as descriptions of features specific to particular embodiments of the disclosure. Certain features that are described in this document in the context of separate embodiments can also be implemented in combination in a single embodiment. Conversely, various features that are described in the context of a single embodiment can also be implemented in multiple embodiments separately or in any suitable subcombination.

Moreover, although features may be described above as acting in certain combinations and even initially claimed as such, one or more features from a claimed combination can in some cases be exercised from the combination, and the claimed combination may be directed to a subcombination or a variation of a subcombination.

What is claimed:

1. A system for use in a receive chain of a communication device, the system comprising:
    a logarithmic amplifying circuit configured to receive an input signal at an input of the system having a first frequency and to generate an oscillation based on the input signal;
    a sampling circuit coupled to the logarithmic amplifying circuit and configured to:
        compare an input signal magnitude of the input signal with a predetermined input signal magnitude threshold; and
        terminate the oscillation when the input signal magnitude is equal to or greater than the predetermined input signal magnitude threshold so as to periodically clamp and restart the oscillation to generate a series of voltage spikes;
    a first resonant circuit coupled to the logarithmic amplifying circuit and configured to establish a frequency of operation of the system; and
    a second resonant circuit coupled to at least one of the first resonant circuit or the logarithmic amplifying circuit and configured to generate an output signal at an output of the system having a second frequency, the second frequency being substantially the same as the first frequency, wherein the output signal is generated without frequency conversion of the input signal.

2. The system of claim 1, wherein:
the second resonant circuit is coupled in series with the logarithmic amplifying circuit at an input side or an output side of the logarithmic amplifying circuit.

3. The system of claim 1, wherein:
the second resonant circuit comprises a series resonant circuit portion coupled in series with the logarithmic amplifying circuit and a parallel resonant circuit portion coupled in parallel with the logarithmic amplifying circuit.

4. The system of claim 3, wherein:
the parallel resonant circuit portion includes an inductor coupled in parallel with two capacitors and a third capacitor coupled to a common node between the two capacitors, wherein values of the inductor and the capacitors are configured to output the signal having the RF frequencies.

5. The system of claim 4, wherein:
the two capacitors and the third capacitor are critically coupled.

6. The system of claim 3, wherein:
the series resonant circuit portion includes a capacitor and an inductor coupled in series.

7. The system of claim 1, wherein:
the second resonant circuit comprises one or more components, the one or more components optimized to match an output impedance.

8. The system of claim 1, wherein:
one or more of the first and second resonant circuits comprise a plurality of components, one or more of which are configured to be of high Q.

9. The system of claim 8, wherein:
the one or more components include one or more of a SAW filter, a BAW filter, a crystal filter, a ceramic filter, a mechanical filter, an LC resonator, an active RC, a variation of RC or LC where C is replaced with a variable capacitor, or an active component with variable capacitance.

10. The system of claim 1, wherein:
the system is configured to replace a low noise amplifier in the receive chain of the communication device.

11. The system of claim 5, wherein:
the second resonant circuit includes at least an inductor, a capacitor, and a resonator.

12. The system of claim 11, wherein:
the inductor is coupled in between the logarithmic amplifying circuit and a voltage source, and wherein the resonator includes one or more of a differential input/output device, a SAW filter, a BAW filter, a crystal filter, a ceramic filter, a mechanical filter, an LC resonator, an active RC, a variation of RC or LC where C is replaced with a variable capacitor, or an active component with variable capacitance.

13. The system of claim 5, wherein:
the second resonant circuit operates independently of the logarithmic amplifying circuit.

14. A system for use as a complement of a low noise amplifier and configured to be placed before or after the low noise amplifier in a receive chain of a communication device, the system comprising:
a logarithmic amplifying circuit configured to receive an input signal at an input of the system having a first frequency and to generate an oscillation based on the input signal;
a sampling circuit coupled to the logarithmic amplifying circuit and configured to:
compare an input signal magnitude of the input signal with a predetermined input signal magnitude threshold; and
terminate the oscillation when the input signal magnitude is equal to or greater than the predetermined input signal magnitude threshold so as to periodically clamp and restart the oscillation to generate a series of voltage spikes;
a first resonant circuit coupled to the logarithmic amplifying circuit and configured to establish a frequency of operation of the system; and
a second resonant circuit coupled to at least one of the first resonant circuit or the logarithmic amplifying circuit and configured to generate an output signal at an output of the system having a second frequency, the second frequency being substantially the same as the first frequency, wherein the output signal is generated without frequency conversion of the input signal, and wherein the input of the system or the output of the system is coupled to the low noise amplifier.

15. The system of claim 14, further comprising:
a phase lock loop having an output split into a first output and a second output, the second output being adapted as an input to a voltage range frequency divider feeding frequency/phase comparator, wherein the comparator is configured to receive a second input signal F_reference frequency divided by a factor M, wherein the comparator output driving a low pass filter through a switch, wherein the switch is enabled by a digitally shaped signal of a second output of the system, and wherein the low pass is driving an additional input of the system.

16. A method for improving receive sensitivity in a receive chain of a communication device, the method comprising:
amplifying, by a logarithmic amplifier, a receive input signal having a first frequency and generating an oscillation based on the input signal;
sampling the amplified signal;
comparing an input signal magnitude of the input signal with a predetermined input signal magnitude threshold;
terminating the oscillation when the input signal magnitude is equal to or greater than the predetermined input signal magnitude threshold so as to periodically clamp and restart the oscillation to generate a series of voltage spikes;
establishing a frequency of operation by a first resonant circuit; and
outputting an output signal having RF frequencies substantially the same as the first frequency by a second resonant circuit without performing frequency conversion of the input signal.

17. The method of claim 16, wherein:
outputting the output signal is performed independently of establishing the frequency of operation.

18. The method of claim 16, wherein:
outputting the output signal includes optimizing the second resonant circuit to match an output impedance.

19. The method of claim 18, further comprising:
increasing a sensitivity of the receive chain by reducing a bandwidth of at least one of the first or the second resonant circuits.

20. The method of claim 19, wherein:
the bandwidth is reduced by at least one of selecting one or more high Q components of at least one of the first or the second resonant circuits, setting an instantaneous logarithmic amplifier gain of the receive chain, or setting a one-cycle-quenching gain of the receive chain.

* * * * *